United States Patent

Kasai

[19]

[11] Patent Number: 5,622,507
[45] Date of Patent: Apr. 22, 1997

[54] ELECTRICAL CONNECTION BOX

[75] Inventor: Koji Kasai, Yokkaichi, Japan

[73] Assignee: Sumitomo Wiring Systems, Ltd., Yokkaichi, Japan

[21] Appl. No.: 528,216

[22] Filed: Sep. 13, 1995

[30] Foreign Application Priority Data

Nov. 16, 1994 [JP] Japan .................................. 6-282153

[51] Int. Cl.$^6$ ...................................................... H01R 9/24
[52] U.S. Cl. ............................................. 439/76.2; 439/34
[58] Field of Search ................................... 439/76.2, 271, 439/281, 693, 34

[56] References Cited

U.S. PATENT DOCUMENTS

| | | | |
|---|---|---|---|
| 4,850,884 | 7/1989 | Sawai et al. | 439/76.2 |
| 5,378,168 | 1/1995 | Sumida | 439/358 |
| 5,403,193 | 4/1995 | Ito et al. | 439/76.2 |

*Primary Examiner*—P. Austin Bradley
*Assistant Examiner*—T. C. Patel
*Attorney, Agent, or Firm*—Greenblum & Bernstein P.L.C.

[57] ABSTRACT

An electrical connection box including a casing in which a bus bar constituting an internal circuit of the electrical connection box and formed by an electrically conductive metal plate is provided through an insulating plate and on an outer face of which a connective portion having a relay or the like electrically connected to a tab of the bus bar through a plurality of relay terminals is provided; wherein the relay includes a plurality of terminals having an identical length but different widths, respectively, while the relay terminals have different lengths for the terminals of the relay, respectively; the electrical connection box comprising: a pillow portion for upwardly lifting a lower end of a shorter one of the relay terminals, which is projected from an upper face of the insulating plate such that an upper end of the shorter one of the relay terminals substantially coincides with an upper end of a longer one of the relay terminals.

2 Claims, 8 Drawing Sheets

ELECTRICAL CONNECTION BOX

BACKGROUND OF THE INVENTION

The present invention generally relates to electrical connection boxes and more particularly, to an electrical connection box in which tabs of bus bars inside a casing are connected to terminals of a relay or the like outside the casing through relay terminals, respectively.

In an electrical connection box used for connecting wiring harnesses, etc. for a motor vehicle to various electrical devices through branching, a branch connection point is concentrated at a spot such that branch connection of wires is performed reasonably and economically. In response to recent trends towards higher density of the wiring harnesses, various types of electrical connection boxes are developed separately for types of motor vehicles or applications.

In such a known electrical connection box as described above, bus bars each formed by an electrically conductive metal plate are provided in a casing through insulating plates so as to constitute an internal circuit, while a connective portion in which a relay or the like is electrically connected to tabs of the bus bars through relay terminals is provided on an outer face of the casing.

Figure 1:
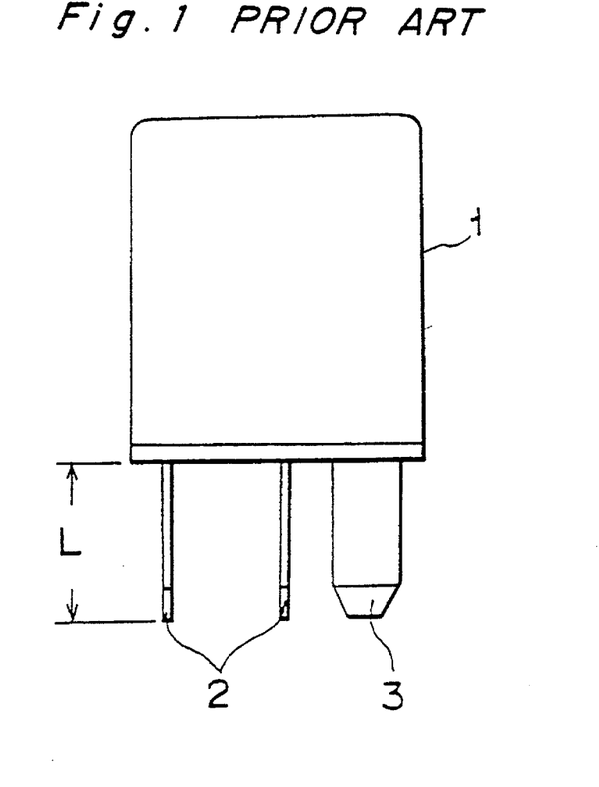
FIGS. 1 and 2 are a front elevational view and a bottom plan view of a prior art composite relay, respectively (already referred to)
Figure 2:
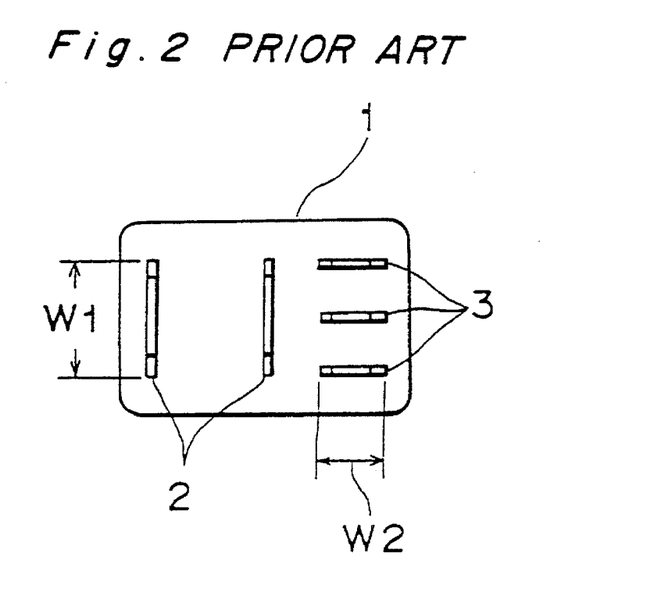

As shown in FIGS. 1 and 2, a known composite relay 1 may include a plurality of terminals 2 and 3 which have an identical length L but have different widths W1 and W2, respectively so as to conform to specifications such as allowable current and the width W1 is larger than the width W2.

Figure 3:
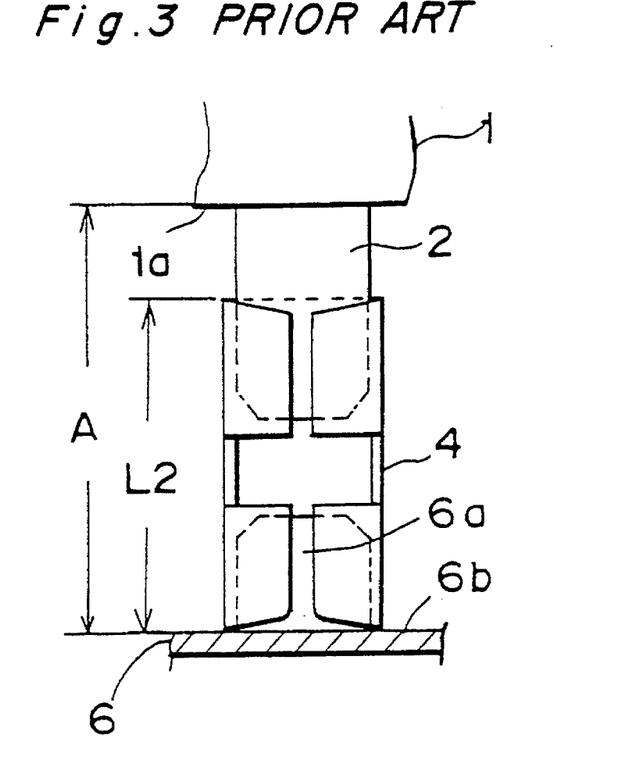
FIGS. 3, 4 and 5 are a front elevational view, a side elevational view and a bottom plan view of a prior art long relay terminal, respectively (already referred to)
Figure 4:
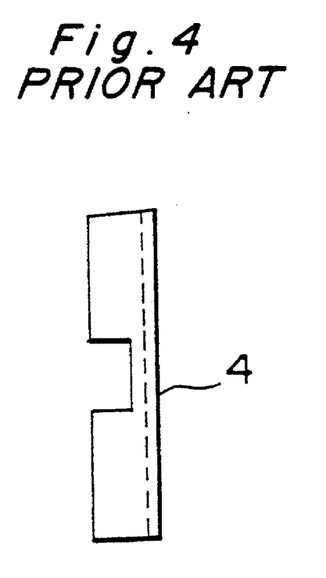
Figure 5:
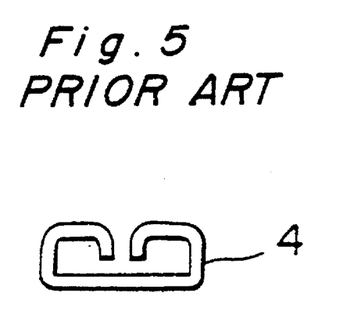
Figure 6:
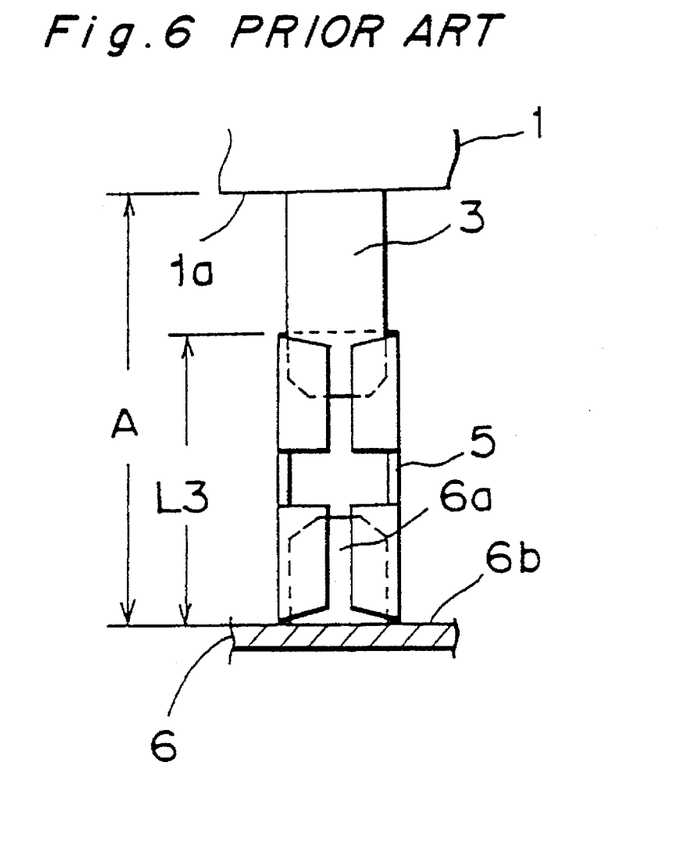
FIGS. 6, 7 and 8 are a front elevational view, a side elevational view and a bottom plan view of a prior art short relay terminal, respectively (already referred to)
Figure 7:
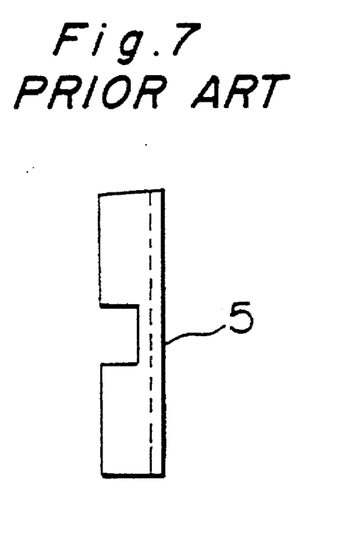
Figure 8:
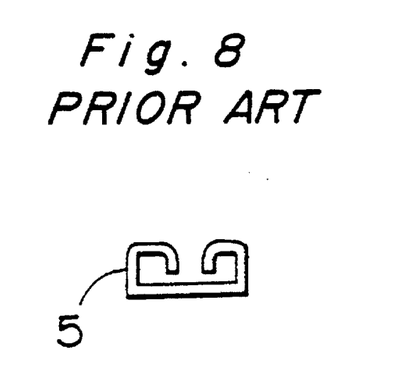

Meanwhile, as shown in FIGS. 3 to 5 and FIGS. 6 to 8, relay terminals 4 and 5 used for the terminals 2 and 3, respectively have different lengths L2 and L3, respectively stipulated for the widths W1 and W2 of the terminals 2 and 3 of the relay 1 by standards and the length L2 is larger than the length L3. However, a distance A between an upper face 6b of a bus bar 6 in a casing and a lower face 1a of a relay 1 connected to a connective portion of the casing in FIG. 3 is identical with that of FIG. 6. Therefore, as shown in FIG. 3, the wide terminal 2 can be connected to the long relay terminal 4 over an electrically stable length, while as shown in FIG. 6, the narrow terminal 3 cannot be connected to the short relay terminal 5 over an electrically stable length.

Furthermore, when the relay 1 is attached to or detached from the relay terminal 5, such a problem may arise that the relay terminal 5 moves greatly upwardly and downwardly in the connective portion of the casing, so that length of connection of the relay terminal 5 to a tab 6a of the bus bar 6 changes and thus, the relay terminal 5 cannot be connected to the tab 6a of the bus bar 6 over an electrically stable length.

In order to obviate this inconvenience, another relay terminal 5 which has the length L2 of the relay terminal 4 may be produced additionally. However, in this case, such drawbacks are incurred that production cost of the different relay terminals 5 rises due to production cost for their different dies, etc. and production control of the relay terminals 5 deteriorates through increase of the number of kinds of the relay terminals 5.

SUMMARY OF THE INVENTION

Accordingly, an essential object of the present invention is to provide, with a view to eliminating the above mentioned drawbacks of conventional electrical connection boxes, an electrical connection box in which terminals such as relays can be connected to, at low cost and over an electrically stable length, relay terminals connected to tabs of bus bars in a casing and having different lengths, respectively.

In order to accomplish this object of the present invention, an electrical connection box according to a first embodiment of the present invention includes a casing in which a bus bar constituting an internal circuit of the electrical connection box and formed by an electrically conductive metal plate is provided through an insulating plate and on an outer face of which a connective portion having a relay or the like electrically connected to a tab of the bus bar through a plurality of relay terminals is provided; wherein the relay includes a plurality of terminals having an identical length but different widths, respectively, while the relay terminals have different lengths for the terminals of the relay, respectively; the electrical connection box comprising a pillar portion for engaging a lower end of a shorter one of the relay terminals, which is projected from an upper face of the insulating plate such that an upper end of the shorter one of the relay terminals substantially coincides with an upper end of a longer one of the relay terminals.

In accordance with the present invention, the narrow terminal of the relay or the like can be connected to the short relay terminal over an electrically stable length in the same manner as the relay terminal for the wide terminal.

Meanwhile, since the relay terminal for the narrow terminal is held in the connective portion of the casing without moving greatly upwardly and downwardly in the same manner as the relay terminal for the wide terminal, length of connection of the relay terminal for the narrow terminal to the tab of the bus bar does not change and thus, the relay terminal for the narrow terminal can be connected to the tab of the bus bar over an electrically stable length in the same manner as the relay terminal for the wide terminal.

Furthermore, another relay terminal for the narrow terminal, which has the length of the relay terminal for the wide terminal, is not required to be produced, the relay terminals for the narrow terminals can be produced at low cost and production control of the relay terminals for the narrow terminals is facilitated by preventing increase of the number of kinds of the relay terminals for the narrow terminals.

In the second embodiment of the present invention, the pillow portion of the insulating plate is replaced by a shoulder portion projecting from a base of the bus bar.

BRIEF DESCRIPTION OF THE DRAWINGS

This object and features of the present invention will become apparent from the following description taken in conjunction with the preferred embodiments thereof with reference to the accompanying drawings, in which.

Before the description of he present invention proceeds, it is to be noted that like parts are designated by like reference numerals throughout several views of the accompanying drawings.

DETAILED DESCRIPTION OF THE INVENTION

Figure 9:
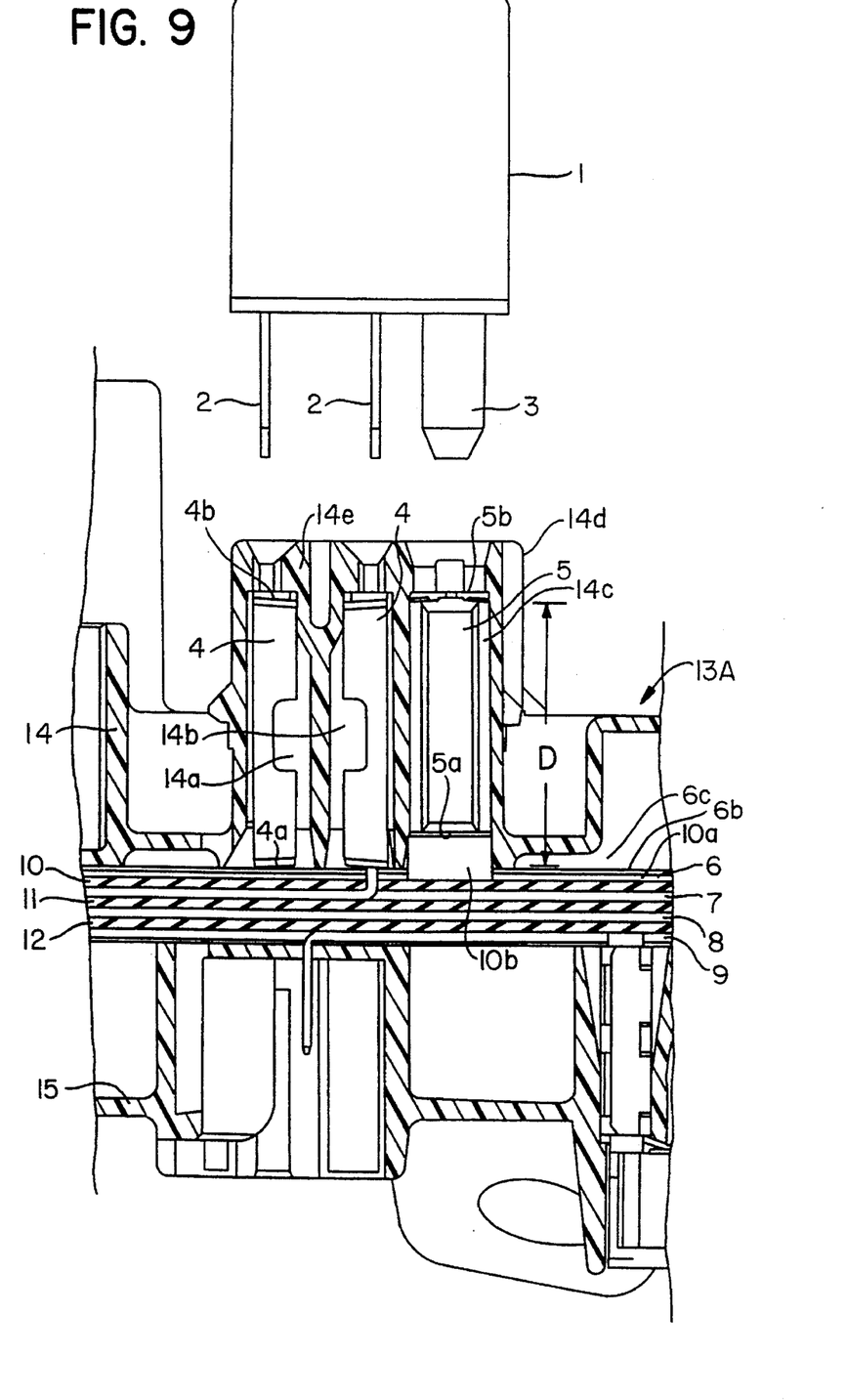
FIG. 9 is a sectional view of an electrical connection box according to a first embodiment of the present invention prior to its connection to a relay.

Referring now to the drawings, there is shown in FIGS. 9 to 15, an electrical connection box 13A according to a first embodiment of the present invention. As shown in FIG. 9, the electrical connection box 13A includes an upper casing 14 and a lower casing 15. In the upper and lower casings 14 and 15, bus bars 6 to 9, an insulating plate 10 for effecting insulation between the bus bars 6 and 7, an insulating plate 11 for effecting insulation between the bus bars 7 and 8 and an insulating plate 12 for effecting insulation between the bus bars 8 and 9 are provided in a plurality of layers, respectively.

A connective portion 14d in which spaces 14a and 14b for accommodating relay terminals 4 each having a length L2, respectively and a space 14c for accommodating a relay terminal 5 having a length L3 (L2>L3) in the same manner as in FIGS. 3 and 6 are formed on an upper face of the upper casing 14. Actually, the number of the relay terminals 5 provided in the connective portion 14d is equal to that of terminals 3 of a relay 1. In the same manner as in FIG. 2, the relay 1 has terminals 2 having a width W1 and the terminals 3 having a width W2 (W1>W2).

A depth D of the spaces 14a to 14c is set so as to secure such a gap relative to the long relay terminal 4 that the relay terminal 4 does not move greatly upwardly and downwardly through contact of a lower end 4a of the relay terminal 4 with an insulating coat 6c on an upper face 6b of the bus bar 6 of the first layer and contact of an upper end 4b of the relay terminal 4 with a bottom 14e of each of the spaces 14a to 14c.

Figure 10:
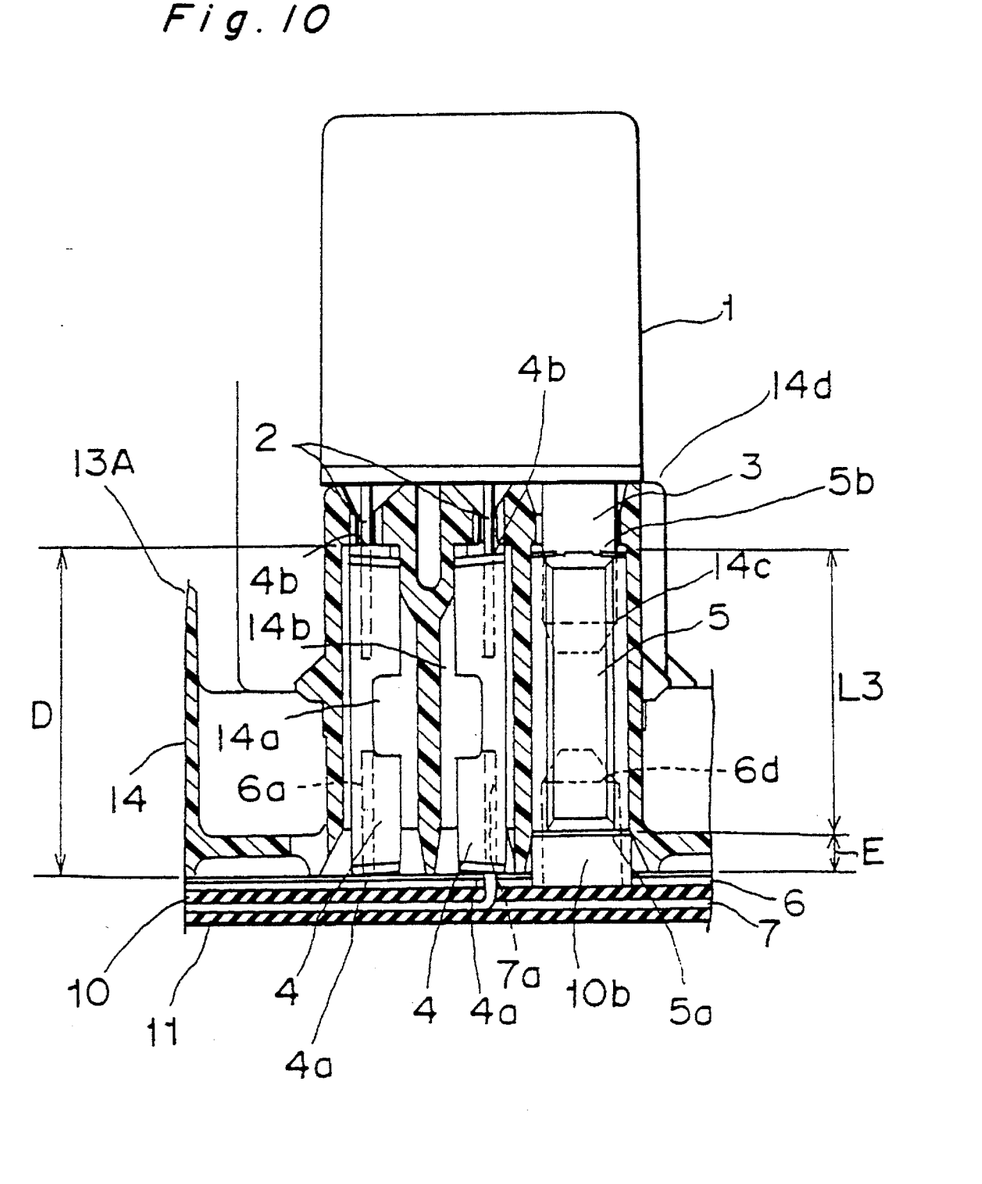
FIG. 10 is a sectional view of the electrical connection box of FIG. 9 after its connection to the relay.

As shown in FIG. 10, a tab 6a of the bus bar 6 of the first layer is inserted over an electrically stable length into the lower end 4a of the long relay terminal 4 accommodated in the left space 14a so as to be connected to the lower end 4a of the relay terminal 4, while a tab 7a of the bus bar 7 of the second layer is inserted over an electrically stable length into the lower end 4a of the long relay terminal 4 accommodated in the middle space 14b so as to be connected to the lower end 4a of the relay terminal 4.

Figure 13:
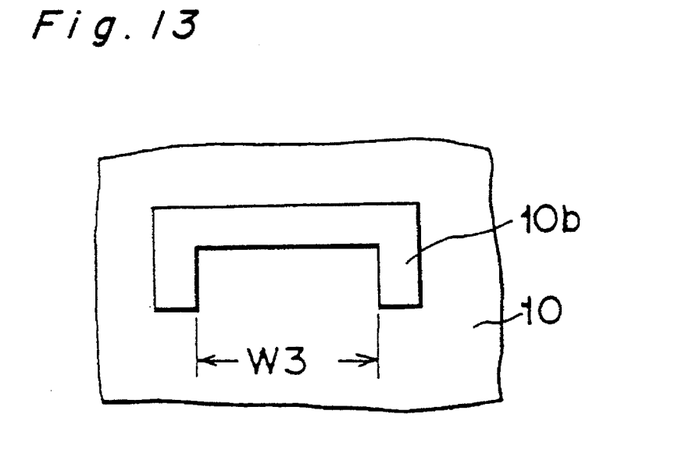
Figure 14:
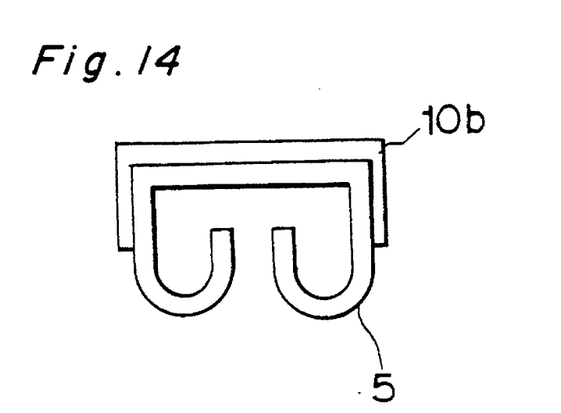
FIG. 14 is a top plan view of the pillar portion of the insulating plate of FIG. 11 after mounting of the relay terminal of FIG. 11 thereon.
Figure 15:
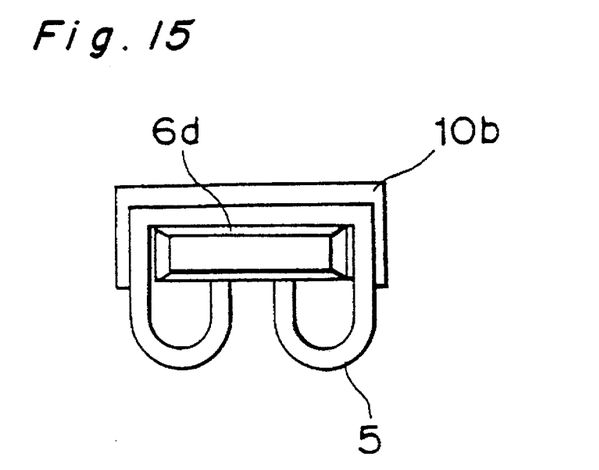
FIG. 15 is a top plan view of the pillar portion of the insulating plate of FIG. 14 after connection of a tab of a bus bar to the relay terminal of FIG. 14.

On the other hand, since the depth D of the right space 14c is larger than the length L3 of the short relay terminal 5, a gap E is produced between a lower end 5a of the relay terminal 5 and the insulating coat 6c of the bus bar 6. Therefore, as shown in FIGS. 11 to 15, a pillar portion 10b is integrally projected from an upper face 10a of the uppermost insulating plate 10 disposed immediately below the space 14c so as to upwardly lift the lower end 5a of the relay terminal 5 such that an upper end 5b of the relay terminal 5 coincides with the upper end 4b of the relay terminal 4. As shown in FIG. 13, the pillar portion 10b is substantially U-shaped when viewed from above so as to have a slot of a width W3 such that opposite side portions of the relay terminal 5 are fitted into the slot. A height T of the pillar portion 10b is equal to a sum of the gap E, a thickness t1 of the bus bar 6 and a thickness t2 of the insulating coat 6c. Also in view of the height T of the pillar portion 10b, a tab 6d of the bus bar 6, which is made longer than the tab 6a, is inserted over an electrically stable length into the lower end 5a of the relay terminal 5 so as to be connected to the lower end 5a of the relay terminal 5.

Figure 11:
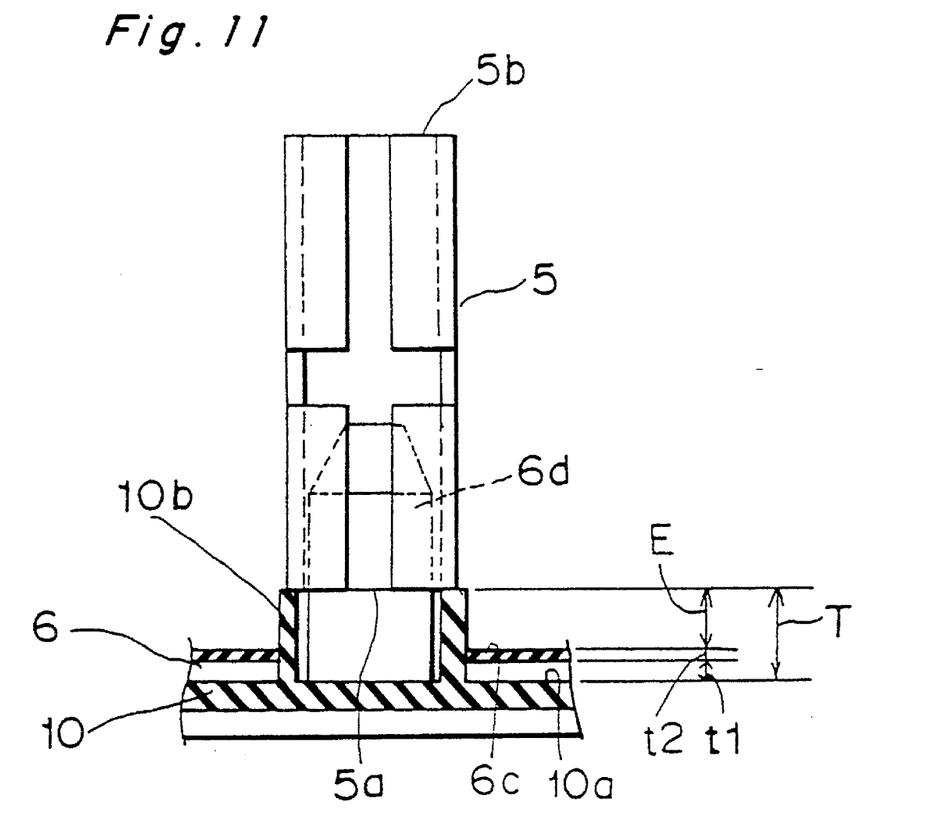
FIG. 11 is a sectional view showing connection between a pillar portion of an insulating plate and a relay terminal in the electrical connection box of FIG. 9.
Figure 12:
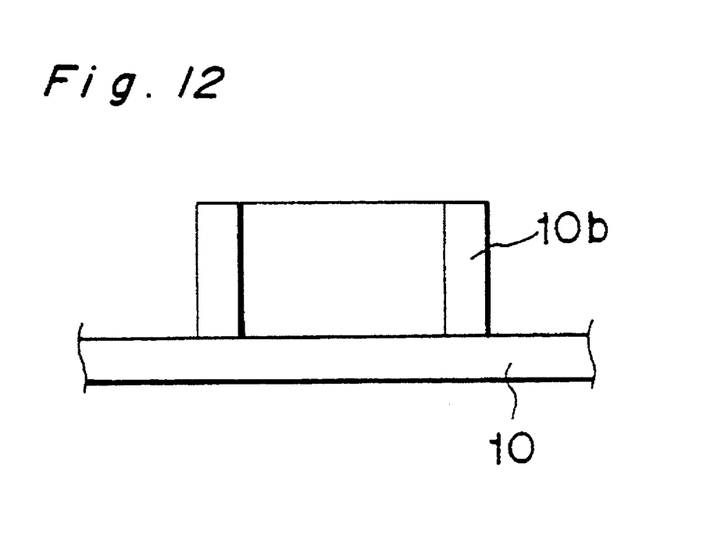
FIGS. 12 and 13 are a side elevational view and a top plan view of the pillar portion of the insulating plate of FIG. 11, respectively.

In the space 14c of the connective portion 14d of the upper casing 14 of the above described arrangement, the lower end 5a of the short relay terminal 5 is raised upwardly by the pillar portion 10b of the insulating plate 10 such that the upper end 5b of the relay terminal 5 substantially coincides with the upper end 4b of each of the long relay terminals 4 accommodated in the spaces 14a and 14b, respectively. Therefore, in the same manner as the long relay terminal 4, the narrow terminal 3 of the relay 1 can be inserted into the upper end 5b of the short relay terminal 5 over an electrically stable length so as to be connected to the upper end 5b of the relay terminal 5.

Meanwhile, since the lower end 5a of the relay terminal 5 is lifted upwardly by the pillar portion 10b, the relay terminal 5 is held in the space 14c of the connective portion 14d without moving greatly upwardly and downwardly in the same manner as the relay terminal 4 for the wide terminal 2. Therefore, risk is eliminated that length of connection of the relay terminal 5 to the tab 6d of the bus bar 6 changes, so that the relay terminal 5 can be electrically connected to the tab 6d of the bus bar 6 stably.

Furthermore, another narrow relay terminal 5 having the length L2 of the relay terminal 4 is not required to be produced additionally. Accordingly, the relay terminals 5 can be produced at low cost. Furthermore, since the number of kinds of the relay terminals 5 is not increased, production control of the relay terminals 5 is facilitated.

Figure 16:
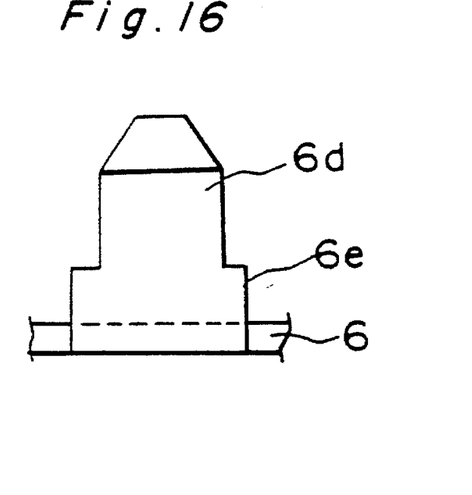
FIGS. 16 and 17 are a front elevational view and a side elevational view of a tab of a bus bar of an electrical connection box according to a second embodiment of the present invention, respectively.
Figure 17:
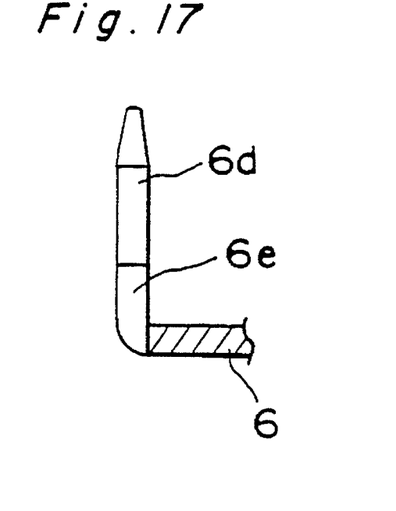
Figure 18:
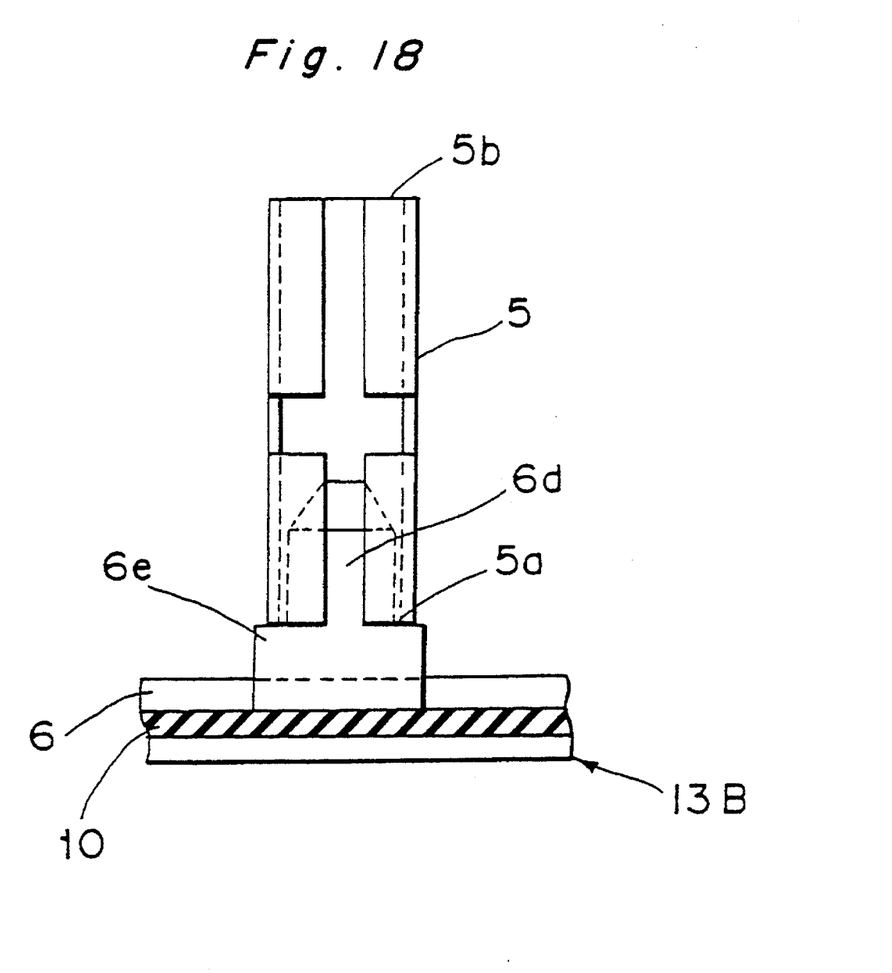
FIG. 18 is a front elevational view showing connection between a shoulder portion of the tab of the bus bar of FIG. 16 and a relay terminal.

In the electrical connection box 13A of the first embodiment, the lower end 5a of the relay terminal 5 is lifted upwardly by the pillar portion 10b projecting from the upper face 10a of the insulating plate 10. However, as shown in FIGS. 16 to 18 illustrating an electrical connection box 13B according to a second embodiment of the present invention, a shoulder portion 6e for upwardly lifting the lower end 5a of the relay terminal 5 may also be formed integrally at a base of the tab 6d of the bus bar 6 of the first layer. In this case, production cost for a molding die, etc. can be reduced further than the first embodiment in which the pillar portion 10b is provided on the insulating plate 10.

As is clear from the foregoing description of the electrical connection box of the first embodiment, the pillar portion is projected from the upper face of the insulating plate in the casing so as to upwardly lift the lower end of the short relay terminal such that the upper end of the short relay terminal substantially coincides with that of the long relay terminal.

Therefore, the narrow terminal of the relay or the like can be connected to the short relay terminal over an electrically stable length in the same manner as the relay terminal for the wide terminal.

Meanwhile, in the same manner as the relay terminal for the wide terminal, the relay terminal for the narrow terminal is held in the connective portion of the casing without moving greatly upwardly and downwardly. Accordingly, risk is eliminated that length of connection of the relay terminal for the narrow terminal to the tab of the bus bar changes, so that the relay terminal for the narrow terminal can be connected to the tab of the bus bar over an electrically stable length.

Furthermore, since another relay terminal for the narrow terminal, which has the length of the relay terminal for the wide terminal, is not required to be produced additionally, the relay terminals for the narrow terminals can be produced at low cost and production control of the relay terminals for the narrow terminals is facilitated by preventing increase of the number of kinds of the relay terminals for the narrow terminals.

In the electrical connection of the second embodiment, the shoulder portion for upwardly lifting the lower end of the short relay terminal is projected at the base of the bus bar in the casing such that the upper end of the short relay terminal substantially coincides with that of the long relay terminal. Therefore, in addition to the above mentioned effects of the first embodiment, production cost for he molding die can be reduced further than the first embodiment.

What is claimed is:

1. An electrical connection box including a casing in which a bus bar constituting an internal circuit of the electrical connection box and formed by an electrically conductive metal plate is provided through an insulating plate and on an outer face of which a connective portion having a relay electrically connected to a tab of the bus bar through a plurality of relay terminals is provided;

wherein the relay includes a plurality of terminals having an identical length but different widths, respectively, while the relay terminals have different lengths for the terminals of the relay, respectively;

the electrical connection box comprising:

a pillar portion for engaging a lower end of a shorter one of the relay terminals, which is projected from an upper face of the insulating plate such that an upper end of the shorter one of the relay terminals substantially coincides with an upper end of a longer one of the relay terminals.

2. An electrical connection box including a casing in which a bus bar constituting an internal circuit of the electrical connection box and formed by an electrically conductive metal plate is provided through an insulating plate and on an outer face of which a connective portion having a relay electrically connected to a tab of the bus bar through a plurality of relay terminals is provided;

wherein the relay includes a plurality of terminals having an identical length but different widths, respectively, while the relay terminals have different lengths for the terminals of the relay, respectively;

the electrical connection box comprising:

a shoulder portion for engaging a lower end of a shorter one of the relay terminals, which is projected from a base of the bus bar such that an upper end of the shorter one of the relay terminals substantially coincides with an upper end of a longer one of the relay terminals.

* * * * *

UNITED STATES PATENT AND TRADEMARK OFFICE
CERTIFICATE OF CORRECTION

PATENT NO. : 5,622,507
DATED : April 22, 1997
INVENTOR(S) : Koji KASAI

It is certified that error appears in the above-indentified patent and that said Letters Patent is hereby corrected as shown below:

On the title page, in item [51, "ABSTRACT", line 11, change "pillow" to ---pillar---.

Signed and Sealed this

Ninth Day of September, 1997

Attest:

BRUCE LEHMAN

*Attesting Officer*    *Commissioner of Patents and Trademarks*